United States Patent

[11] 3,619,651

[72] Inventor Richard A. Aldrich
Sunnyvale, Calif.
[21] Appl. No. 874,763
[22] Filed Nov. 7, 1969
[45] Patented Nov. 9, 1971
[73] Assignee Anderson Jacobson, Inc.
Mountain View, Calif.

[54] DIGITAL FREQUENCY DISCRIMINATOR

10 Claims, 3 Drawing Figs.

[52] U.S. Cl. .......... 307/233, 328/134
[51] Int. Cl. .......... H03k 5/20
[50] Field of Search .......... 324/79, 78, 79 D, 78 I; 307/232, 233, 261, 295; 328/109, 110, 133, 134, 138, 140, 141

[56] References Cited

UNITED STATES PATENTS

| | | | |
|---|---|---|---|
| 2,851,596 | 9/1958 | Hilton | 328/48 |
| 2,878,448 | 3/1959 | Maxey | 328/134 X |
| 3,069,623 | 12/1962 | Murgio | 328/134 X |
| 3,092,736 | 6/1963 | Ernyei | 307/295 X |
| 3,408,581 | 10/1968 | Wakamoto et al. | 328/134 X |
| 3,418,585 | 12/1968 | Harnett | 328/109 X |

*Primary Examiner*—Donald D. Forrer
*Assistant Examiner*—R. E. Hart
*Attorney*—Lindenberg, Freilich & Wasserman

ABSTRACT: A digital frequency discriminator providing an output of a first level when the frequency of an input signal is above a known frequency, while providing an output of a second level when the input signal frequency is below the known frequency. The discriminator provides two complementary square waves with frequencies corresponding to the input signal frequencies. The two square waves are supplied to set and reset a flip-flop which is clocked by clock pulses, produced by a timing circuit, which is activated by a ramp voltage generator. The latter controls the timing circuit to provide each clock pulse a fixed period after the start of each input signal cycle, the period being equal to one-half the period of one cycle at the known frequency. Added circuitry may be included to control the digital output to be provided only if the input signal is of not less than a minimum frequency.

INVENTOR.
RICHARD A. ALDRICH
BY Lindenberg & Freilich
ATTORNEYS

RICHARD A. ALDRICH
INVENTOR.

BY Lindenberg & Freilich

ATTORNEYS

DIGITAL FREQUENCY DISCRIMINATOR

BACKGROUND OF THE INVENTION

1. Field of the Invention

The present invention generally relates to signal discriminators and, more particularly, to a simple digital frequency discriminator.

2. Description of the Prior Art

There are many applications in which it is either necessary or desirable to discriminate between frequencies of signals, such as sinusoidal signals, which are supplied to, or propagate through electronic circuits. In some applications where the signal frequency may vary between two frequency values or frequencies, one above and one below a known frequency, it is often desirable to provide a digital output which is of a first value or level when the signal frequency is above the known frequency, and of a second level when the signal frequency is below the known frequency.

Typically herebefore, frequency discrimination has required the use of transformers, inductors and relatively large size capacitors, all of which increase the discriminator's cost, complexity and size. Furthermore, the need for transformers and inductors prevents the manufacturing of the discriminator into a small integrated or hybrid circuit so that the complete unit is as small and as light as possible, properties which are highly desirable in modern electronic circuit applications.

OBJECTS AND SUMMARY OF THE INVENTION

It is a primary object of the present invention to provide a new improved frequency discriminator.

Another object of the present invention is to provide a new improved digital frequency discriminator.

A further object of the present invention is the provision of a reliable, simple and relatively inexpensive frequency discriminator which provides a digital output of either a first or a second level when the frequency of the input signals is respectively, above or below a known frequency.

Still a further object of the present invention is to provide a simple low-cost digital frequency discriminator which does not require the use of transformers and/or inductors.

These and other objects of the present invention are achieved by providing a discriminator in which the input signal is amplified, limited and then converted into two complementary square wave signals or simply waves with frequencies corresponding to those of the input signal. The two square waves are supplied to the set (S) and reset (R) input terminals of a bistable element, such as a flip-flop. One of the square waves is supplied to a ramp generator, which is in turn connected to a timing circuit. The ramp generator is activated by each transition, such as the negative transition, in the square wave. It is controlled to reach a selected voltage level a fixed interval after each negative transition. The fixed interval is chosen to be one-half the period of the known frequency.

At the end of each fixed interval, when the desired voltage level is reached, the timing circuit produces a clock pulse which is supplied to the flip-flop to set or reset it, depending on the levels at its S and R input terminals. In one embodiment it is the state of the flip-flop, as represented by its output level, which represents the discriminator's digital output. The output is of a first level when the frequency of the input signal is above the known frequency, while being of a second level when the input signal frequency is below the known frequency. In another embodiment the discriminator includes an output unit whose output represents the discriminator's output. The output unit is enabled only when a selected number of cycles of the input signal occur during a preselected time period or when the input amplitude is above a threshold voltage, thereby inhibiting the production of an output other than in response to a meaningful input signal.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
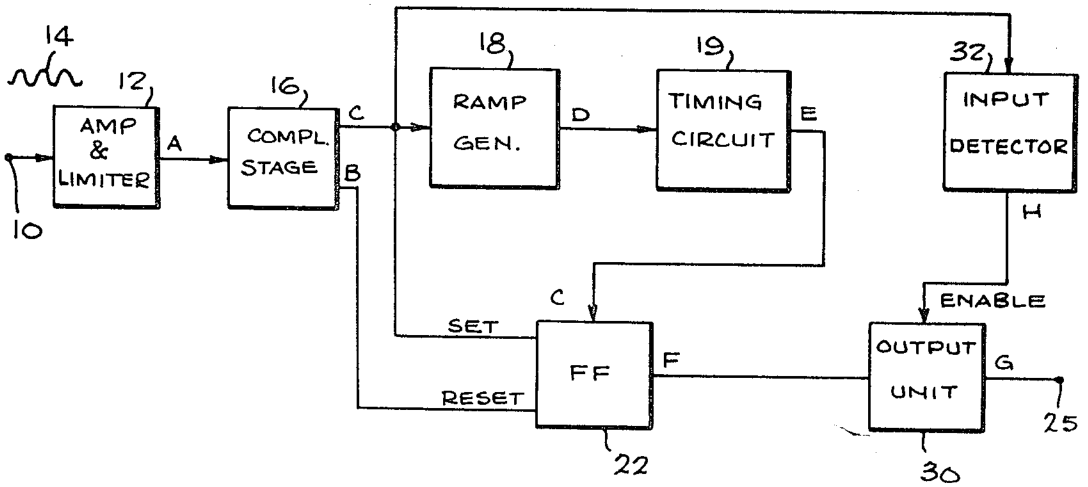
FIG. 1 is a block diagram of the embodiments of the discriminator of the present invention.

Referring now to FIG. 1 which is a block diagram of a preferred embodiment of the present invention, an input signal, whose frequency is to be discriminated with respect to a known frequency, is assumed to be received at an input terminal 10, which is connected to an amplifier and limiter 12. Assuming that the input signal is sinusoidal, as represented by the waveform 14, the amplifier and limiter 12 transform the input signal into a square wave, shown as A in FIG. 2. This waveform which represents the limiter's output is supplied to a complementary stage 16, whose outputs are two complementary square waves B and C (see FIG. 2).

The frequencies of square wave A and those of square waves B and C correspond to the frequencies of the input signal 14. Since square wave C is essentially the same as square wave A, if A is a true square wave, with sharp transitions, stage 16 may be replaced by an inverter to produce square wave B, only. However, assuming that the output of a single limiter is not a true square wave, stage 16 is included to provided the two complementary square waves, B and C with sharp transitions, needed for the operation of the present invention.

Figure 2:
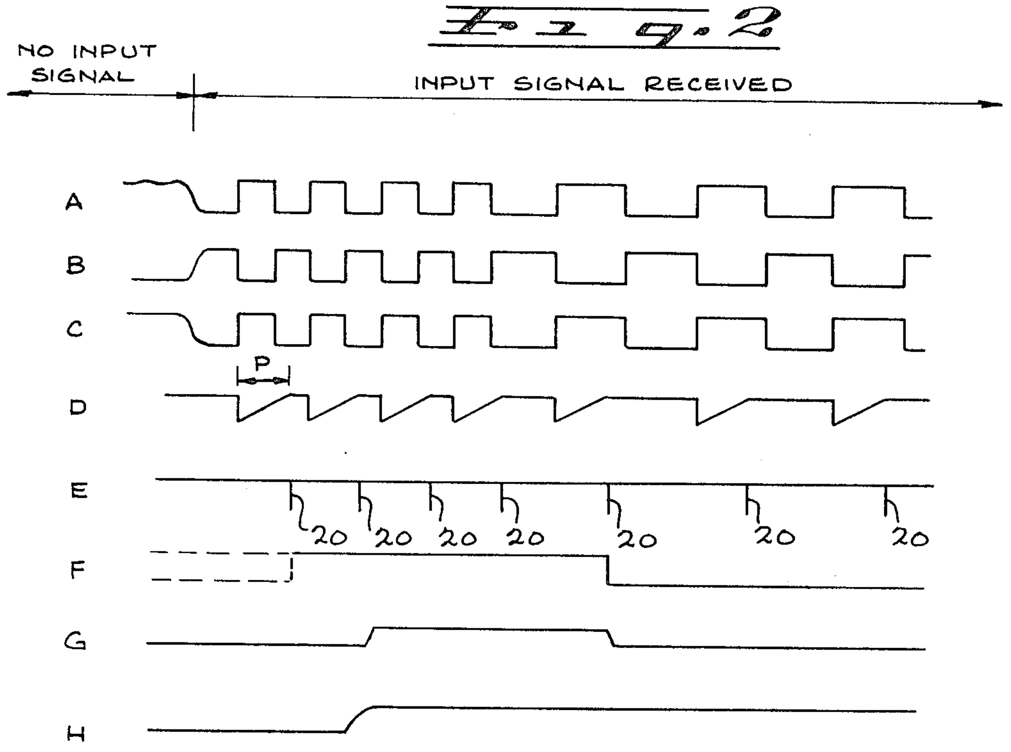
FIG. 2 is a multiline waveform diagram of the outputs of the various blocks, shown in FIG. 1.

The square wave C is supplied to a ramp generator 18, whose output, represented by the waveform D in FIG. 2, is supplied to a timing circuit 19. The latter's output, represented by pulse 20 in the waveform E of FIG. 2 is supplied at a clock (C) terminal of a clocked type flip-flop (FF) 22. The square waves B and C of stage 16 are connected to the reset (R) and set (S) input terminal of FF22, respectively. The flip-flop is assumed to be set to provide an output of a first or high level when, coincident with the application of a clock pulse 20, the square wave C is at its low level, while the flip-flop is reset when pulse 20 is applied.

In a particular embodiment for which the waveform shown in FIG. 2 is diagrammed, the ramp generator 18 is operated so that each positive transition of square wave C activates the ramp generator 18. As a result, its output D drops to a low level, and thereafter, its output rise linearly toward its high level, as seen from output D in FIG. 2. The ramp generator is adjusted so that after activation, its output reaches its high level after a fixed selected interval. This interval, designated P in FIG. 2, is chosen to equal one-half the period of one cycle at the known frequency. Consequently, it is less than one-half the period of a cycle at a frequency which is lower than the known frequency and more than one-half the period of a cycle at a frequency which is higher than the known frequency. As a result, the flip-flop is in a set state, so that its output (see output F in FIG. 2) is at the high level as long as the frequency of the input signal is greater than the known frequency. However, when the input signal frequency is less than the known frequency, the flip-flop is reset, so that its output is at a low level.

In a preferred embodiment, such as the one diagrammed in FIG. 1, the output F of FF22 is supplied to an output terminal 25 of the discriminator through an output unit 30. The latter is enabled by an input detector 32 to provide an output at terminal 25, which corresponds to the FF's output level, only if a selected number of cycles of the input signal, represented by a selected number of transitions of one of the square waves, occur at a selected duration, or sufficient input voltage amplitude exists. In FIG. 2, the outputs of the units 30 and detector 32 are represented by waveforms G and H respectively. Thus, by incorporating unit 30 and detector 32, a meaningful digital output is only produced if a meaningful input signal is actually applied to the discriminator's input terminal 10.

Figure 3:
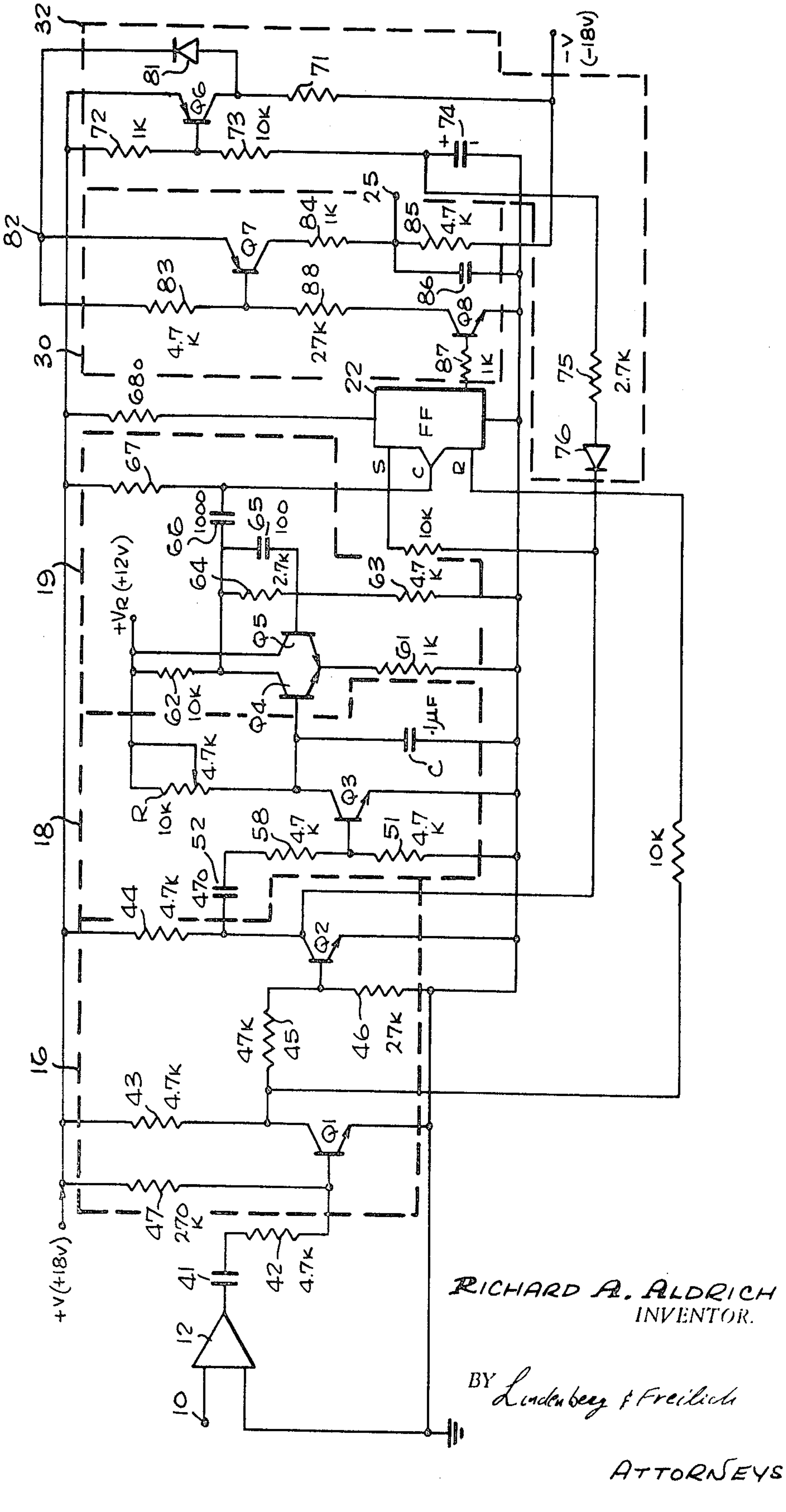
FIG. 3 is a schematic diagram of an embodiment of the invention which was actually reduced to practice.

Reference is now made to FIG. 3 which is a schematic diagram of the embodiment, herebefore explained in connection with FIGS. 1 and 2. In FIG. 3, the values of the components and the potentials represent actual values employed in an embodiment, which was actually reduced to practice to discriminate between frequencies of 1170 and 1830 Hz. Basically, the output of the amplifier and limiter 12 is supplied to the base of a transistor Q1, which forms part of stage 16 through a DC-blocking capacitor 41 and a resistor 42.

Stage 16 includes a second transistor Q2, resistors 43 and 44, which connect the collector of Q1 and Q2 respectively, to a positive potential, designated +V, resistors 45 and 46 connected in series between the collector of Q1 and a potential level, such as ground. The junction point between resistors 45 and 46 is connected to the base of Q2, while the base of Q1 is connected to +v through a resistor 47. The levels at the collectors of Q1 and Q2 represent the outputs B and C of the complementary stage 16.

Resistor 47 keeps Q1 turned ON when no input signal is being received. When the output A is high, Q1 conducts, so that output B is low. When B is low, Q2 is cut off so that output C is high.

The ramp generator 18 comprises a transistor Q3, with its collector connected to $+V_R$, through a variable resistor R, and to ground, through a capacitor C. The emitter is connected to ground, while the base is also connected to ground, through a resistor 51 and to the collector of Q2, through a capacitor 52 and a resistor 58. Generally, when Q3 is cut off, the capacitor C is charged positively. However, when the collector of Q2 switches from a low level to a high level, i.e., when output C exhibits a positive transition, due to capacitor 52 a positive pulse is applied at the base of Q3, switching the latter to a conductive state for a very short duration. This duration is sufficient for capacitor C to be discharged, through the collector-emitter of Q3. Then, when Q3 is again cut off, the capacitor starts to charge up toward the potential $+V_R$.

The timing circuit 19 is shown comprising transistors Q4 and Q5 with their emitters tied to ground through a resistor 61. The base of Q4, which serves as the input terminal of the timing circuit, is tied to the collector of Q3 while the collector of Q4 is connected to $+V_R$ through a resistor 62. The collector of Q5 is directly connected to $+V_R$. The base of Q5 is connected to ground, through resistor 63 and to the collector of Q4, through a resistor 64, shunted by a capacitor 65. The collector of Q4 is also connected to +V through a capacitor 66, connected in series with a resistor 67, with the junction point of these two elements being connected to the C input clock terminal of FF22. This junction point represents the output terminal of the timing circuit at which output E comprising pulses 20 appears.

As should be appreciated by those familiar with the art, as the base of Q4 reaches the same voltage which is present at the base of Q5, Q4 starts to conduct, i.e., is turned ON. Consequently, the voltage of the base of Q5 is reduced, causing Q4 to turn ON harder. The capacitor 65 is included to shunt the resistor 64 to AC signals, thereby aiding the switching action. As a result, whenever the output of the ramp of the generator 18 reaches its high level, a negative going pulse 20 (see FIG. 2), representing a clock pulse is applied to the flip-flop.

The rate of capacitor charging, i.e., the slope of the ramp, shown in FIG. 2, and therefore the period, P required for the output D to reach the high level, is controlled by the setting of resistor R. Resistor R is set so that each clock pulse 20 occurs during the second-half of each input signal of the high frequency, above the known frequency, while occurring during the first-half of each input signal of a low frequency below the known frequency.

The input detector 32 is shown comprising a PNP transistor Q6 with its emitter tied to +V, and its collector tied to −V, through a resistor 71. The base of Q6 is connected to +V, through a resistor 72 and to ground, through serially connected resistor 73 and capacitor 74. The junction point between the two latter-mentioned elements is tied to Q2 through serially connected resistor 75 and diode 76. In the absence of an input signal, Q6 is cut off and capacitor 74 is charged toward +V. As an input signal is received, each time Q2 is switched ON, it provides a path to ground through which capacitor 74 discharges. If cycles of the input signal arrive at least a minimum predetermined rate, the capacitor 74 discharges sufficiently, thereby lowering the voltage at the base of Q6 to a sufficient level, so that Q6 is switched ON. Consequently its collector is at substantially +V.

The collector of Q6 is connected through a diode 81 to a terminal 82, which represents the ENABLE terminal of output unit 30. This unit includes a transistor Q7, having its emitter tied to terminal 82, to which the base of Q7 is also connected through a resistor 83. The collector of Q7 is connected to −V through serially connected resistors 84 and 85. Their junction point is connected to ground, through a capacitor 86 and to the discriminator's output terminal 25. Unit 30 also includes a second transistor Q8 which acts as a signal inverter. Its base is tied to the output of FF22 through a resistor 87, its emitter is connected to ground, and its collector is tied to the base of Q7 through a resistor 88.

In operation, in the absence of an input signal Q6 is cut off. Consequently, Q7 is cut off. However, once cycles of the input signal arrive at the minimal rate Q6 is switched ON, +V potential is applied to terminal 82, enabling Q7 to be switched ON, when the output of FF22 is high. Thus, the output at terminal 25 is at a high level. However, Q7 remains cut off even when +V is applied at terminal 82, when the output of FF22 is low so that Q8 is cut off and the potential at the base of Q7 is high, approximately +v, preventing Q7 from conducting. Thus, the output at terminal 25 is at a low level.

As seen from FIG. 3, the teachers of the present invention are implementable without transformers or inductors. The discriminator requires only several simple transistors and simple resistors and a few capacitors all of which lend themselves to integrated circuit fabrication. Such an integrated circuit can be combined with the several required capacitors and an external variable resistor R to from a small and relatively inexpensive hybrid unit.

The discriminator of the present invention can be employed whenever it is necessary to discriminate between frequencies of input signals above and below a known frequency. The farther apart the input frequencies get from each other the larger the amount of distortion which can exist in the incoming signal waveform. The discriminator provides an output of a first level, such as high, when the frequency of the incoming signal is above that of the known frequency while an output of another level such as low is provided when the input signal frequency is below the known frequency.

Although a particular embodiment of the invention has been described and illustrated herein, it is recognized that modifications and variations may readily occur to those skilled in the art and consequently it is intended that the claims be interpreter to cover such modifications and equivalents.

What is claimed is:

1. A frequency discriminator comprising:

first means for receiving a succession of input signals having frequencies to be discriminated with respect to a known frequency for providing two complementary successions of square wave signals having frequencies corresponding to the frequencies of said input signals;

second means responsive to one of said two complementary successions of square wave signals for providing a clock pulse at a preselected duration after the start of each signal in said one succession of square wave lengths, said preselected duration being equal to one-half the period of a signal at said known frequencies; and third means responsive to said two successions of square wave signals and said clock pulses for providing an output of a first level when the frequency of an input signal is above said known frequency and for providing an output of a second level when the input signal frequency is below said known frequency.

2. The arrangement as recited in claim 1 wherein said third means comprises a clockable flip-flop which is settable to provide an output of said first level if the level of a one of said two successions of square wave signals is of a first value when a clock pulse is applied to said flip-flop, said flip-flop being resettable to provide an output of a second level if the level of the other of said two successions of square wave signals is of said first value when a clock pulse is applied to said flip-flop.

3. The arrangement as recited in claim 2 wherein said succession of input signals comprises a succession of sinusoidal signals of frequencies which are either above or below said known frequency and said first means comprise means responsive to said succession of sinusoidal signals for providing said two complementary successions of square wave signals.

4. The arrangement as recited in claim 1 wherein said second means includes ramp voltage generating means which is activated by the start of each square wave signal in said one succession of square wave signals to provide a ramp voltage having a preselected rate of voltage change, and timing means for providing a clock pulse each time said ramp voltages reaches a preselected level.

5. The arrangement as recited in claim 4 wherein said third means comprises a clockable flip-flop which is settable to provide an output of said first level if the level of a one of said two successions of square wave signals is of a first value when a clock pulse is applied to said flip-flop, said flip-flop being resettable to provide an output of a second level if the level of the other of said two successions of square wave signals is of said first value when a clock pulse is applied to said flip-flop.

6. The arrangement as recited in claim 5 wherein said succession of input signals comprises a succession of sinusoidal signals of frequencies which are either above or below said known frequency and said first means comprise means responsive to said succession of sinusoidal signals for providing said two complementary successions of square wave signals.

7. The arrangement as recited in claim 1 further including an output unit responsive to the levels of the output of said third means, and input signals detecting means coupled to said first means for enabling said output unit to provide an output of either a first level or a second level as a function of the output levels of said third means only if a selected number of input signals are detected by said detecting means during a selected interval.

8. The arrangement as recited in claim 7 wherein said second means includes ramp voltage generating means which is activated by the start of each square wave signal in said one succession of square wave signals to provide a ramp voltage having a preselected rate of voltage change, and timing means for providing a clock pulse each time and said ramp voltage reaches a preselected level.

9. The arrangement as recited in claim 8 wherein said succession of input signals comprises a succession of sinusoidal signals of frequencies which are either above or below said known frequency and said first means comprise means responsive to said succession of sinusoidal signals for providing said two complementary successions of square wave signals.

10. The arrangement as recited in claim 9 wherein said third means comprises a clockable flip-flop which is settable to provide an output of said first level if the level of a one of said two successions of square wave signals is of a first value when a clock pulse is applied to said flip-flop, said flip-flop being resettable to provide an output of a second level if the level of the other of said two successions of square wave signals is of said first value when a clock pulse is applied to said flip-flop.

* * * * *